United States Patent [19]
DeVilbiss

[11] Patent Number: 5,721,699
[45] Date of Patent: Feb. 24, 1998

[54] FERROELECTRIC MEMORY WITH FEEDBACK CIRCUIT

[75] Inventor: Alan DeVilbiss, Colorado Springs, Colo.

[73] Assignee: Symetrix Corporation, Colorado Springs, Colo.

[21] Appl. No.: 617,243

[22] Filed: Mar. 18, 1996

[51] Int. Cl.$^6$ .................................................. G11C 7/00
[52] U.S. Cl. .................................. 365/145; 365/149
[58] Field of Search ........................... 365/145, 149

[56] References Cited

U.S. PATENT DOCUMENTS

| | | | |
|---|---|---|---|
| 4,809,225 | 2/1989 | Dümmler et al. | 365/145 |
| 4,853,893 | 8/1989 | Eaton, Jr. et al. | 365/145 |
| 4,873,664 | 10/1989 | Eaton, Jr. | 365/145 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 5,010,518 | 4/1991 | Toda | 365/145 |
| 5,038,323 | 8/1991 | Schwee | 365/145 |
| 5,086,412 | 2/1992 | Jaffe et al. | 365/145 |
| 5,198,706 | 3/1993 | Papaliolios | 307/465 |
| 5,262,982 | 11/1993 | Brassington et al. | 365/145 |
| 5,297,077 | 3/1994 | Imai et al. | 365/145 |
| 5,309,391 | 5/1994 | Papaliolios | 365/145 |
| 5,406,510 | 4/1995 | Mihara et al. | 365/145 |

*Primary Examiner*—David C. Nelms
*Assistant Examiner*—Hien Nguyen
*Attorney, Agent, or Firm*—Duft, Graziano & Forest, P.C.

[57] ABSTRACT

A memory cell includes a ferroelectric capacitor and a transistor connected between one side of the capacitor and a bit line. A drive circuit includes an operational amplifier having an output, an inverting input, and a non-inverting input. A plate line is connected between the other side of the capacitor and the output. The non-inverting input is connected to a data-in line through a first resistor and to the bit line through a second resistor. The inverting input is connected to a constant voltage source through a third resistor, and to the plate line through a fourth resistor. A first buffer amplifier is connected between the bit line and the second resistor, and a second buffer amplifier is connected between the plate line and the fourth resistor. Voltage is connected to the other one of the operational amplifier inputs.

3 Claims, 2 Drawing Sheets

FERROELECTRIC MEMORY WITH FEEDBACK CIRCUIT

BACKGROUND OF THE INVENTION

1. Field of the Invention

The invention in general relates to electronic memories, and more particularly to such a memory that applies the full programming voltage across the memory element during the read and write functions.

2. Statement of the Problem

It is well-known that ferroelectric materials are capable of retaining a polarization which can be used to store information in a non-volatile memory. For example, if a strong enough electric field is placed across a ferroelectric capacitor, when the electric field is removed, a polarization in the direction of the field remains. If the field is placed across the same capacitor in the opposite direction, when the field is removed, a polarization in the opposite direction remains. Electronic circuits have been designed to associate the polarization in one direction with a digital logic "1" state, and polarization in the opposite direction with a logic "0" state. Some examples of such memories circuits are described in U.S. Pat. No. 4,809,225 issued to Klaus Dimmler and S. Sheffield Eaton, Jr., U.S. Pat. No. 4,853,893 issued to S. Sheffield Eaton, Jr. and Michael Parris, U.S. Pat. No. 4,873,664 issued to S. Sheffield Eaton, Jr., U.S. Pat. No. 4,888,733 issued to Kenneth J. Mobley, U.S. Pat. No. 893,272 issued to S. Sheffield Eaton, Jr., Douglas Butler, and Michael Parris, U.S. Pat. No. 4,910,708 and U.S. Pat. No. 4,914,627 issued to S. Sheffield Eaton, Jr., U.S. Pat. No. 5,010,518 issued to Haruki Toda, U.S. Pat. No. 5,038,323 issued to Leonard J. Schwee, U.S. Pat. No. 5,086,412 issued to James M. Jaffe and Norman E. Abt, U.S. Pat. No. 5,198,706 issued to Andreas G. Papaliolios, and U.S. Pat. No. 5,406,510 issued to Takashi Mihara, Carlos A. Paz De Araujo, and Larry D. McMillan. All these patents utilize memory array structures including memory cells arranged in rows and columns, each memory cell including at least one transistor having a gate and a pair of source/drains, a capacitor having a pair of plate electrodes, and the memory also including in some form plate lines connected to one plate of the capacitor in each cell, bit lines connected to the other plate of the capacitor through the transistor, word lines connected to the control gate of the transistor, and sense amplifiers. Each is characterized by the bit line having a certain capacitance, which can be represented by a bit line "capacitor". Each of these memories is read by placing a programmed voltage sufficient to switch the ferroelectric capacitor across the ferroelectric capacitor. In each memory, the transistor is closed during a read operation, thereby placing the programmed voltage across the combination of the ferroelectric capacitor and the bit line capacitor. If the ferroelectric capacitor switches, a different voltage appears on the bit line than if the ferroelectric capacitor does not switch. The sense amplifier senses the difference and amplifies it to provide the output data signal.

In the read operation of all the above devices, the bit line voltage is allowed to float. This results in the ferroelectric capacitor and the bit line capacitor forming a capacitive divider, with part of the programmed voltage appearing across the ferroelectric capacitor and part on the bit line. Since the voltage required to switch the ferroelectric capacitor is just a little less than the nominal operating voltage of these circuits, i.e. three to five volts, most of the voltage must appear across the ferroelectric capacitor to facilitate the possibility of ferroelectric switching, and therefore, the bit line capacitance must be large in comparison to the ferroelectric capacitance. However, the bit line capacitance cannot be so large that the bit line voltage is too small to be sensed reliably by the sense amp. These opposing constraints severely limit the design possibilities in a ferroelectric memory. For example, the small voltage requires very sensitive sense amplifiers, and designs that keep noise to a minimum. As another example, the requirements of bit line capacitance essentially determines the number of cells that can be connected along a single bit line. Further, the opposing constraints lead to ferroelectric memory designs that are unreliable, since if the tolerances are off just a small amount in either direction, the memory does not work. Thus, a ferroelectric memory in which the voltage across the ferroelectric capacitor was independent of the bit line parameters would be highly desirable.

3. Solution to the Problem

The present invention solves the above problem by driving the bit line with a voltage that can vary. The invention provides a feed back connection from the bit line to the circuit that drives the plate line, and the plate line driving circuit using the feed back to drive the plate line to the voltage that creates the full programming voltage across the ferroelectric capacitor, no matter what the voltage is on the bit line. This allows the bit line capacitance to be tailored to other design goals. For example, the bit line capacitance can be closer to, or even equal to the ferroelectric capacitance, increasing the bit line voltage and therefore increasing the signal to noise ratio at the sense amp. This makes the design much less susceptible to tolerance variations and other defects, and therefor increases yield.

The invention provides ferroelectric memory comprising: a memory cell including a ferroelectric memory element capable of taking on a first polarization state corresponding to a logic "1" state and a second polarization state corresponding to a logic "0" state, the memory cell including at least one electrical; a drive circuit having an output for applying an electrical voltage to the terminal of the ferroelectric element; a feedback circuit for providing a feedback signal from the memory cell to the drive circuit; and the drive circuit including an amplifier circuit for adjusting the signal output to the terminal to maintain a predetermined voltage across the memory cell. Preferably, the amplifier circuit includes an operational amplifier having an inverting input, a non-inverting input, and an output, the operational amplifier output comprising the output for applying an electrical voltage to the terminal. Preferably, the ferroelectric memory element comprises a ferroelectric capacitor having a plate line connected to one side of the capacitor and a bit line connected to the other side of the capacitor. Preferably, the output of the operational amplifier is connected to the plate line and the feedback circuit is connected between the bit line and one of the inputs of the operational amplifier. Preferably, the bit line is connected to the non-inverting input, and the plate line is connected to the inverting input. Preferably the memory further includes a transistor connecting the bit line to the other side of the capacitor, a source of a variable voltage, a source of a constant voltage, a first resistor, a second resistor, a third resistor and a fourth resistor, the first resistor connected between the source of variable voltage and the non-inverting input, the second resistor connected between the bit line and the non-inverting input, the third resistor connected between the source of a constant voltage and the inverting input, and the fourth resistor connected between the plate line and the inverting input. Preferably, the varying voltage can take on a value representative of a logic "0" and a value representative of a logic "1", and the constant voltage is half way between the logic "0" voltage and the logic "1" voltage. Preferably, the first resistor has the value "r", the second resistor has the value "a×r", the third resistor has the value "R", and said fourth resistor has the value "a×R", where $1 \leq a \leq 3$. Preferably, the feedback circuit includes a buffer amplifier.

In another aspect the invention provides an integrated circuit memory comprising: a memory cell; a drive circuit for applying a voltage to the memory call; and a connecting circuit electrically connecting the memory cell and the drive circuit, the connecting circuit including a buffer amplifier. Preferably, the memory cell includes a ferroelectric memory element.

In a further aspect, the invention provides an integrated circuit memory comprising: a memory cell; a drive circuit for applying a voltage to the memory cell, the drive circuit including an operational amplifier. Preferably, the memory cell includes a ferroelectric memory element. Preferably, the ferroelectric memory element comprises a ferroelectric capacitor, and the operational amplifier includes an output connected to one side of the ferroelectric capacitor. Preferably, the operational amplifier includes an input and the other side of the ferroelectric capacitor is connected to the input of the operational amplifier. Preferably the integrated circuit includes a bit line connected to the memory cell and a plate line connected to the memory cell, the operational amplifier includes two inputs, and the bit line is connected to one of the operational amplifier inputs and the plate line is connected to the other of the operational amplifier inputs. Preferably, the integrated circuit includes a source of a constant voltage and a source of a variable voltage, the operational amplifier includes two inputs, the source of a constant voltage is connected to one of the operational amplifier inputs, and the source of a variable The invention not only frees up the bit line design criteria, but also ensures that the full programming voltage always appears across the ferroelectric capacitor. Thus, the memory will essentially automatically adjust for variances in manufacturing tolerances that could make prior art designs inoperable. Numerous other features, objects and advantages of the invention will become apparent from the following description when read in conjunction with the accompanying drawings.

DESCRIPTION OF THE PREFERRED EMBODIMENT

Figure 1:
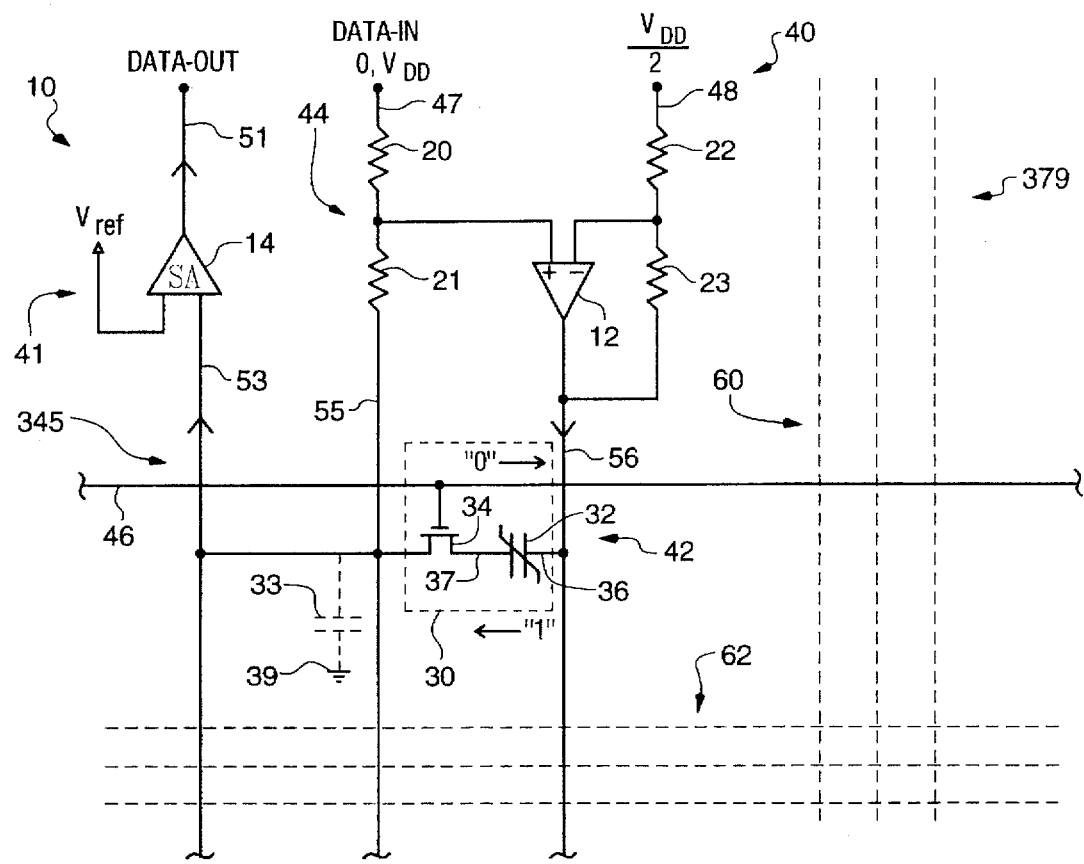
FIG. 1 is a circuit diagram for a portion of a memory according to the preferred embodiment of the invention.
Figure 2:
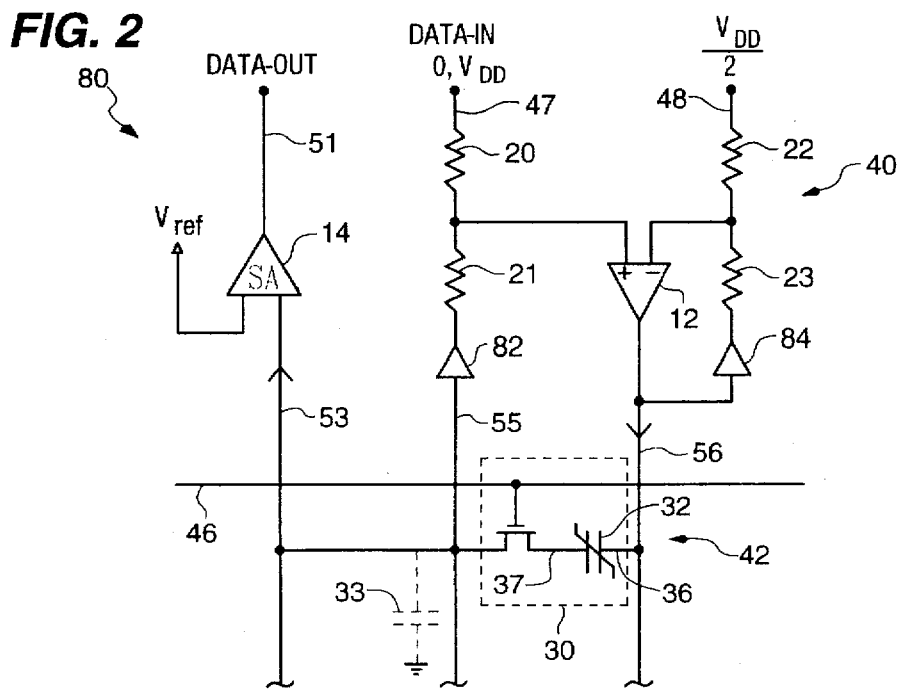
FIG. 2 is a circuit diagram for a portion of an alternative embodiment of a memory according to the invention.
Figure 3:
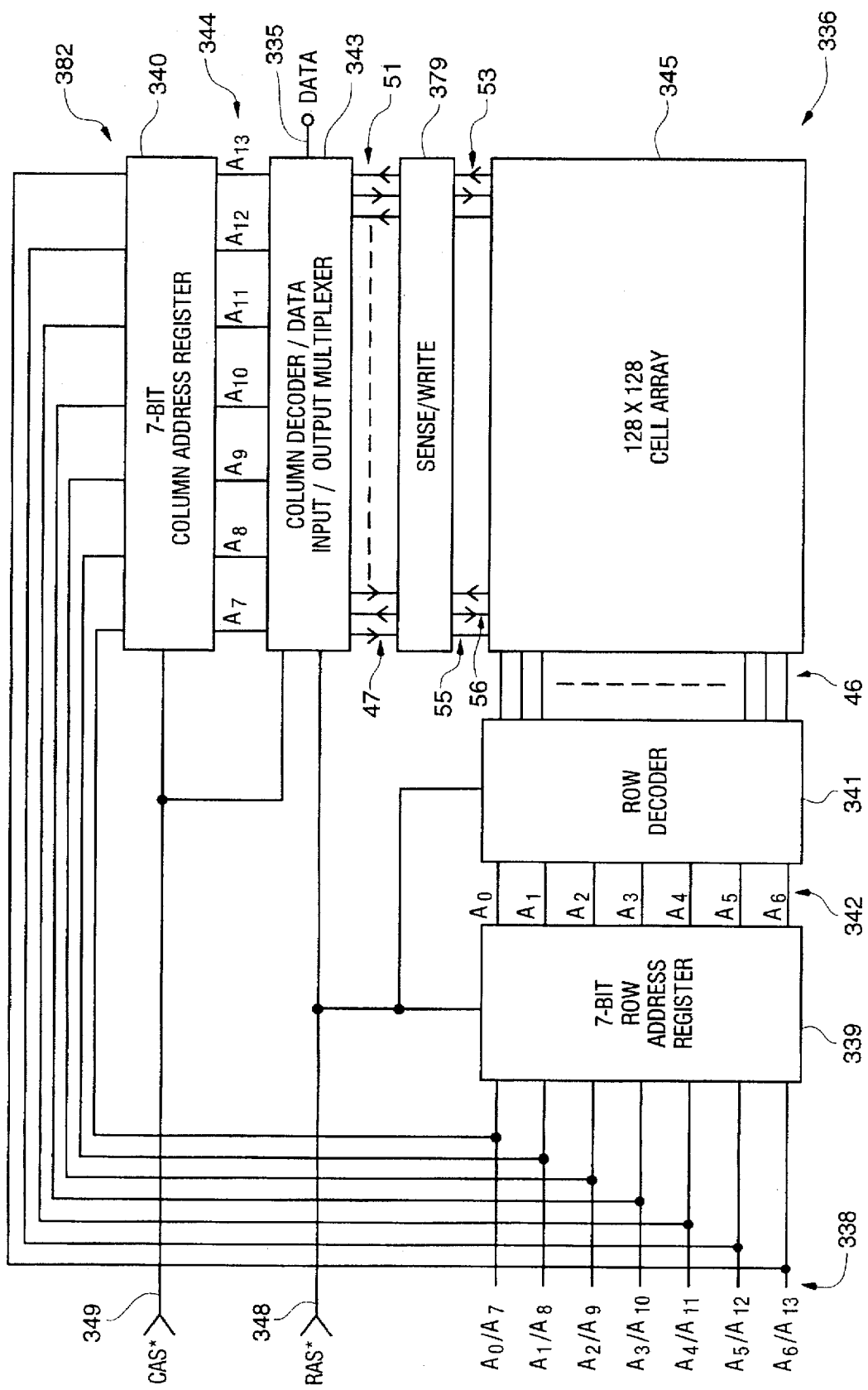
FIG. 3 is shows an exemplary embodiment of a memory according to the invention.

As will be discussed in detail below, a complete memory 336 according to the invention is shown in FIG. 3. Memory 336 includes row address register 339, row decoder 341, column address register 340, column decoder/data input/ output multiplexer 343, sense/write circuitry 379, and memory cell array 345. A portion 10 of the preferred embodiment of memory 336, which includes the key novel elements of cell array 345 and sense/write circuitry 379, is shown in FIG. 1. Similarly, a portion 80 of an alternative embodiment of the invention is shown in FIG. 2.

Turning to FIG. 1, the portion 10 of memory 336 shown includes a capacitor drive circuit 40, a data sense circuit 41, a memory cell/bit line circuit 42, and a feedback circuit 44. We shall first discuss the elements of the portion 10 and how they are connected, and then discuss the general functionality of the memory portion.

Memory portion 10 includes operational amplifier 12, sense amplifier 14, resistors 20-23, memory cell 30 which includes ferroelectric capacitor 32 and transistor 34, word line 46, data-in line 47, data-out line 51, bit line 53, feedback line 55, and plate line 56. Capacitor 33 is shown in ghost since it is not a separate element of the circuit but represents the capacitance to ground of bit line 53. Ground is shown in this disclosure by the conventional symbol, such as at 39. A first terminal 36 of ferroelectric capacitor is connected to the output of operational amplifier 12 via plate line 56 and to the inverting input of op amp 12 through resistor 23. The inverting input of op amp 12 is also connected to a source of one-half the VDD voltage through resistor 22. The second terminal 37 of ferroelectric capacitor 32 is connected to one source/drain of transistor 34. The other source/drain of transistor 34 is connected to sense amp 14 via bit line 53 and to the non-inverting input of op amp 12 via feedback line 55 through feedback resistor 21. The non-inverting input of op amp 12 is also connected to the data-in line 47 through resistor 20. The data-in line provides a voltage of zero or $V_{DD}$ depending on whether the data represents a logic "0" or a logic "1". The second input of sense amp 14 is connected to a reference voltage that is about halfway between the voltage the bit line assumes in a read operation when capacitor 32 is programmed to a logic "0" and the voltage the bit line assumes in a read operation when the capacitor is programmed to a logic "1". The output of sense amp 14 is connected to the data-out line 51. The gate of transistor 34 is connected to word line 46. As is known in the art, the memory cell 30 and its connections to bit line 53, feedback line 55, and plate line 56 are repeated as many times as there are rows in memory 336, as represented by dotted lines 62. Further, the elements of memory portion 10 discussed above in this paragraph are repeated as many times as there are columns in memory 336 as indicated by dotted lines 60. Sense/write circuitry 379 (FIG. 3) comprises the row 41 of sense circuits 14 and drive circuits 40 formed by this repetition of columns. Memory cell array 345 (FIG. 3) comprises the matrix of memory cells 30 formed by the above repetition of rows and columns.

The memory portion 10 operates as follows. If cell 30 is to be written to, a data signal, which is either a zero voltage or a $V_{DD}$ voltage appears on the data-in line 47. At about the same time, word line 46 goes high and transistor 34 becomes conductive. If the voltage on line 47 is zero, the operational amplifier 12 acts to place a $V_{DD}/2$ voltage across memory cell 30 in the direction of the upper arrow. This polarizes the ferroelectric capacitor in the direction of the upper arrow. We assume the convention that this is equivalent to a logic "0" state of the ferroelectric capacitor 32. If the voltage on line 47 is $V_{DD}$, the operational amplifier 12 acts to place a $V_{DD}/2$ voltage across memory cell 30 in the direction of the lower arrow. This polarizes the ferroelectric capacitor in the direction of the lower arrow. We assume the convention that this is equivalent to a logic "1" state of the ferroelectric capacitor 32. If the cell 30 is to be read, a zero voltage appears on the data-in line 47, and shortly thereafter word line 46 goes high turning on transistor 34. Operational amplifier develops a voltage of VDD/2 in the direction of the upper arrow. If ferroelectric capacitor is in the logic "0" state, a charge determined by the linear capacitance of capacitor 32 forms on the capacitor plates and a positive voltage lower than reference voltage Vref develops on bit line 53. The sense amp switches on and lowers the bit line and its output to a logic "0" state, i.e. a zero voltage. Transistor 32 thus stays in the logic "0" state, and then word line 46 goes low and sense amp 14 switches off to complete the read cycle. If ferroelectric capacitor is in the logic "1" state, the ferroelectric capacitor switches, and an additional charge determined by the ferroelectric switching properties of the capacitor 32 forms on the capacitor plates. The bit line therefor rises to a voltage higher than the voltage when the capacitor 32 was in a logic "0" state, which voltage is higher than the reference voltage $V_{ref}$. The sense amp switches on and raises the bit line and its output to a logic "1" state, i.e. the $V_{DD}$ voltage. Transistor 32 thus switches back to the logic "1" state, and then word line 46 goes low and sense amp 14 switches off to complete the read cycle.

FIG. 2 shows an alternative embodiment of a portion 80 of memory 336. This embodiment is the same as the embodiment of FIG. 1 except it includes buffer amplifies 82 and 84. Buffer amplifier 82 is connected between bit line 53 and resistor 21, with its output toward the resistor, while buffer amplifier 84 is connected between plate line 56 and resistor 23, with its output toward the resistor. All other parts of the circuit are the same as in FIG. 1, and are numbered the same for clarity. Additional rows and columns similar to rows 62 and column 60, except with buffer amplifiers corresponding to buffer amplifiers 82 and 84, are also part of the portion 80, but are not shown in FIG. 2 to simplify the drawing. The circuit of FIG. 2 operates the same as the circuit of FIG. 1, except that the buffer amplifiers 82 and 84 prevents current from flowing between memory cell/bit line circuit 42 and drive circuit 40. This ensures that the current flowing into and out of ferroelectric capacitor 32 is the same as the current flowing from and to the bit line 53. Thus, maximum voltages are developed on the bit line 53. The buffer amps 82 and 84 also serve as line drivers to the inputs of operational amplifier 12, thereby improving the overall reliability of the circuit functions.

In both the circuit of FIGS. 1 and 2, the resistors 20 and 21 preferably have the values "r" and "a×r", and the resistors 22 and 23 have the values "R" and "a×R". Thus, drive circuit 40 is a variable reference amplifier with a gain of "a". That is, if a voltage difference or signal of "V" is developed between line 47 and plate reference line 48, a signal of amplitude "a×V" will be applied across the cell 30. As long as the signal applied across the cell 30 is within the voltage and current compliance and the operational bandwidth of op amp 12, the undistorted shape and amplitude of the signal across the cell 30 is maintained, regardless of the capacitance or other aspects of the bit line 53. As long as the impedance of the bit line is small compared to the combined impedance of the resistors "r" and "a×r", the voltage developed on the bit line will, to a good approximation, be proportional to the charge displaced within the capacitor 32. When the buffers 82 and 84 am used as in FIG. 2, this is even more true. Thus, the repeatability and accuracy of operation, and reliability of the memory function is much enhanced by the design. The value of "a" generally may be between 1 and 3, and at the higher values offers the advantage that the read and write functions across the cell will operate at a higher voltage than the rest of the integrated circuit memory. Since the functions of the cell are the critical functions of the memory and are more accurate and repeatable at higher voltages, and lower voltages in the rest of the circuit results in lower current and heat development in the bulk of the circuit, this can be a significant advantage. However, in the preferred circuit of FIG. 1, "a" is equal to 1, and the voltage across the capacitor 32 is the same as the voltage difference between lines 47 and 48. The values of resistors 20 through 23 should be significantly higher than the impedance of the bit line 53. Generally the bit line impedance is of the order of a kohm, so the values of resistors 20 through 23 are generally in the range of between 10 kohm and 100 kohm. The precise values selected will depend on the design of the rest of the circuit. Sense amplifier 14, op amp 12, buffer amps 82 and 84, ferroelectric capacitor 32, and transistor 34 are all preferably thin-film integrated circuit devices and are known in the art.

FIG. 3 is a block diagram illustrating an exemplary integrated circuit memory 336 in which memory portions 10, according to the invention are utilized. For simplicity, the embodiment shown is for a 16K×1 memory; however, the invention may be utilized in a wide variety of sizes and types of memories. In the 16K embodiment shown, there are seven address input lines 338 which connect to a row address register 339 and a column address register 340. The row address register 339 is connected to row decoder 341 via seven lines 342, and the column address register 340 is connected to a column decoder/data input output multiplexer 343 via seven lines 344. The row decoder 341 is connected to a 128×128 memory cell array 345 via 128 word lines 46, and the column decoder/data input output multiplexer 343 is connected to the sense/write circuitry 379 via 128 data-out lines 47, i.e. the lines with the arrows pointing toward the column decoder 343, and 128 data-in lines 51, i.e. the lines with the arrows pointing away from the column decoder 343. Likewise, the sense/write circuitry 379 is connected to memory cell array 345 via 128 bit lines 53, i.e. the lines with the arrows pointing toward the sense/write circuitry 379, 128 feedback lines 55, i.e. the lines with no arrow on them, and 128 plate lines 56, i.e. the lines with the arrows pointing away from the sense/write circuitry 379. A RAS* signal line 348 is connected to the row address register 339, row decoder 341, and column decoder/data input/output multiplexer 343, while a CAS* signal line 349 is connected to the column address register 340 and column decoder/data input output multiplexer 343. An input/output data line 335 is connected to the column decoder/data input output multiplexer 343.

Memory cell array 345 contains 128×128=16,384 memory cells, which is conventionally designated as 16K. The cell array 345 may include any of the memory cells discussed above. The operation of the memory 336 is as follows. Row address signals $A_0$ through $A_6$ and column address signals $A_7$ through $A_{13}$ placed on lines 338 are multiplexed by via address registers 339, 340 and the RAS* and CAS* signals to the row decoder 341 and column decoder/data input/output multiplexer 343, respectively. The row decoder 341 places a high signal on the one of the word lines 46 that is addressed. The column decoder/data input output multiplexer 343 either places the data signal from line 335 on the one of the data-in lines 47 corresponding to the column address, or outputs to the data line 335 the signal on the one of the data-out lines 51 corresponding to the column address, depending on whether the function is a write or read function. As is known in the art, the read function is triggered when the RAS* signal precedes the CAS* signal, and the write function is triggered when the CAS* signal comes before the RAS* signal. If the function is a write function, the drive circuitry 40 (FIGS. 1 and 2) for the appropriate column is activated and a signal as described above is placed on the plate line 56 corresponding to that column. If the function is a read function, the sense amp 14 for the appropriate column is turned on and the signal on the one of the bit lines 53 corresponding to that column is sensed. In both the read and write functions, the transistors 34 (FIGS. 1 and 2) in the cells connected to the word line that is high turn on, permitting the data signal on the data-in lines 47 to be written into the capacitors 32, or the logic state on the capacitors 32 to be read out on the bit lines 53, as described above, depending on whether the write or read function is implemented. Other logic required or useful to carry out the functions outlined above, such as the circuits which generate the various voltages and signals used in the memory, as well as other known memory functions are also included in the memory 336 but is not shown or discussed as they are not directly applicable to the invention.

As indicated above, the circuits 10, 80 may be considered to be the combination of a memory cell/bit line circuit 42 comprising capacitor 32, transistor 34, and bit line 53, and drive circuit 40 comprising operational amplifier 12 resistors 20–23, and the circuits that produce the voltages on lines 47 and 48. A feature of the invention is that the memory cell/bit line circuit 42 is isolated from the drive circuit 40. In circuit 10, the isolation is provided primarily by the high impedance of resistors 20–23 23 also by a low offset current in the op amp 12. In the circuit 80 the buffers 82, 84 connect the circuit 40 with the circuit 42 thereby effectively preventing current flow through the connection between the circuits. The isolation of the circuits improves circuit performance in many ways: as mentioned above, since the current generated across capacitor 32 stays in the circuit 42, the signal-to-noise ratio and accuracy of performance improve; the values that the operating voltages across the cell 30 are also more definite, thus allowing closer tolerances in design; moreover, the isolation of the circuits allows their design to be independent significantly improving design flexibility.

It is another feature of the invention that feedback, via feedback circuit 44, is provided from the memory cell/bit line circuit 42 to the drive circuit, to enable the drive circuit 40 to maintain a predetermined voltage across the memory cell 30.

It is a further feature of the invention that the bit line 53 voltage 62 provides the reference voltage into the operational amplifier 12. It is another feature of the invention that the plate line 56 is allowed to "float" to the voltage that will maintain the desired predetermined voltage across the memory cell 30. That is, the voltage on the bit line 53 is input as a reference voltage to the operational amplifier, and the operational amplifier holds its output at the voltage that will cause the voltage drop across the cell 30 to be the predetermined voltage. Thus, the operating voltages of the cell 30 are always accurately known, and errors due to inaccuracies of the applied voltages are eliminated. The combination of the above two features permits the selection of bit line parameters such that its voltage, current, and other electrical parameters will always be much more optimum than in prior art devices. That is, the bit line can be designed such that its performance and the performance of sense amp 14 are optimized, knowing that the rest of the circuit will automatically apply the predetermined voltage across the cell 30.

It is a further feature of the invention that current that flows from or through the capacitor 32 is the same as the current that flows through the bit line 53. In the circuit of FIG. 1, this is true to a good approximation provided the resistors 21 and 22 are chosen properly. In the circuit of FIG. 2, the buffer amplifiers 82 and 84 ensure that this is true to within the tolerances of the buffer appliers, which generally are extremely small as compared to the inaccuracies of the prior art circuits.

It is a related feature of the invention that in the circuit of FIG. 2, the buffer amplifiers control the flow of current to the inputs of the operational amplifier 12. Thus, any offset current that derives from the circuit 42 is virtually eliminated.

It is also a feature of the invention, that although the addition of an operational amplifier 12 in one embodiment and the operational amplifier 12 and buffer amps 82, 84 in another embodiment add some complexity and size to the memory circuit as compared to the simplest DRAM-type designs, the advantages the invention provides allow savings in complexity, size, and tolerances in other portions of the design, which savings more than make up for the complexity and size of the amplifiers. Moreover, the extra size and complexity in the memory 336 according to the invention is located in the peripheral portions of the circuit, where there is generally more room, and the savings in size and tolerances are in the matrix 345, where device area is at a premium and size must be minimized. The speed of circuit response is also increased.

There has been described a simple ferroelectric memory that allows bit line design criteria to be separated from ferroelectric element drive voltage considerations, and has many other advantages. It should be understood that the particular embodiments shown in the drawings and described within this specification are for purposes of example and should not be construed to limit the invention which will be described in the claims below. For example, while the embodiments shown include sense amps and drive circuits on the same side of the circuit and using different lines for the data-in and data-out signals, it is clear that designs that place the sense amps and drive circuits at opposite ends of a bit line which carries both the data-in and data-out signals, as is done in many state-of-the-art DRAMS, may be used. As another example, designs using dummy cells may also be substituted. In fact, because the invention increases design flexibility, many more variations of the memory according to the invention are possible than are possible with prior art memories. Further, it is evident that those skilled in the art may now make numerous uses and modifications of the specific embodiments described, without departing from the inventive concepts. For example, now that the advantages of allowing the plate line voltage to "float" to a voltage that will always produce the full program voltage across the ferroelectric capacitor has been shown, other methods and apparatus that do the same can be substituted. As another example, now that the advantages of providing feedback from the bit line to the plate line drive circuitry has been shown, other feedback circuits may be designed. It is also evident that many different cell and memory architectures that yield the same signals on the write and bit lines can be designed. Or equivalent structures and processes may be substituted for the various structures and processes described. Consequently, the invention is to be construed as embracing each and every novel feature and novel combination of features present in and/or possessed by the ferroelectric memory described.

I claim:

1. A ferroelectric memory comprising:

a memory cell comprising a ferroelectric capacitor having a plate line connected to one side of said capacitor and a bit line connected to the other side of said capacitor;

a drive circuit having an output for applying an electrical voltage to said plate line;

a feedback circuit for providing a feedback signal from said memory cell to said drive circuit;

said drive circuit including an amplifier circuit for adjusting the signal output to said plate line to maintain a predetermined voltage across said memory cell;

said amplifier circuit including an operational amplifier having an inverting input, a non-inverting input, and an output, said operational amplifier output comprising said output for applying an electrical voltage to said plate line;

and wherein said feedback circuit is connected between said bit line and one of said inputs of said operational amplifier, said bit line is connected to said non-inverting input, and said plate line is connected to said inverting input;

said memory further including a source of a variable voltage, a source of a constant voltage, a first resistor, a second resistor, a third resistor and a fourth resistor, said first resistor connected between said source of variable voltage and said non-inverting input, said second resistor connected between said bit line and said non-inverting input, said third resistor connected between said source of a constant voltage and said inverting input, and said fourth resistor connected between said plate line and said inverting input.

2. A ferroelectric memory as in claim 1 wherein said variable voltage includes a voltage value representative of a logic "0" and a voltage value representative of a logic "1", and said constant voltage is halfway between said logic "0" voltage value and said logic "1" voltage value.

3. A ferroelectric memory as in claim 1 wherein said first resistor has the value "r", said second resistor has the value "a×r", said third resistor has the value "R", and said fourth resistor has the value "a×R", where $1 \leq a \leq 3$.

* * * * *